US006556042B1

United States Patent
Kaviani

(10) Patent No.: US 6,556,042 B1
(45) Date of Patent: Apr. 29, 2003

(54) FPGA WITH IMPROVED STRUCTURE FOR IMPLEMENTING LARGE MULTIPLEXERS

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/080,103

(22) Filed: Feb. 20, 2002

(51) Int. Cl.[7] .................. H03K 19/177; H03K 17/62
(52) U.S. Cl. .................. 326/39; 326/47; 327/407
(58) Field of Search .................. 326/37–39, 41, 326/47, 101; 327/407–408

(56) References Cited

U.S. PATENT DOCUMENTS

| | | | | |
|---|---|---|---|---|
| 5,481,206 A | * | 1/1996 | New et al. ................. | 326/38 |
| 5,682,107 A | * | 10/1997 | Tavana et al. ............. | 326/41 |
| 5,850,152 A | * | 12/1998 | Cliff et al. ............... | 326/40 |
| 5,920,202 A | | 7/1999 | Young et al. | |
| 6,075,380 A | * | 6/2000 | Lane ....................... | 326/40 |

OTHER PUBLICATIONS

Xilinx; "The Programmable Logic Data Book 2000"; available from Xilinx, Inc.; 2100 Logic Drive, San Jose, California 95124; pp. 3–75 through 3–96.

Xilinx; "Virtex –II Platform FPGA Handbook"; published Dec. 6, 2000; available from Xilinx, Inc.; 2100 Logic Drive, San Jose, California 95124; pp. 33–75.

* cited by examiner

Primary Examiner—Don Le
Assistant Examiner—James H Cho
(74) Attorney, Agent, or Firm—Lois D. Cartier

(57) ABSTRACT

Novel structures for implementing wide multiplexers from user designs in FPGA CLBs. Input multiplexers providing the function generator data input signals are modified to function not just based on values stored in configuration memory cells, but also under the control of user signals. Thus, the input multiplexers of the invention are much more flexible than traditional input multiplexers. In one embodiment, the improved data input multiplexer is provided on two of four data input terminals of the function generator, enabling the implementation of an 8-to-1 multiplexer using only a single function generator. Another embodiment applies the concept of mixed memory cell and user control of a multiplexer to the general interconnect structure of an FPGA.

10 Claims, 15 Drawing Sheets

FPGA WITH IMPROVED STRUCTURE FOR IMPLEMENTING LARGE MULTIPLEXERS

FIELD OF THE INVENTION

The invention relates to Field Programmable Gate Arrays (FPGAs). More particularly, the invention relates to structures for efficiently implementing large multiplexers in FPGAs.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a general interconnect structure. Some FPGAs also include additional logic blocks with special purposes (e.g., DLLs, RAM, and so forth).

The general interconnect structure, CLBs, IOBs, and other logic blocks are typically programmed by loading a stream of configuration data (bitstream) into internal configuration memory cells that define how the programmable elements are configured. The configuration data may be read from memory (e.g., an external PROM) or written into the FPGA by an external device. The collective states of the individual memory cells then determine the functionality of the FPGA.

Efficient use.of FPGA resources is important, because such efficiency can allow a user design to fit into a smaller (and less expensive) FPGA. For some very large designs, inefficient resource usage can result in an implementation so large it cannot be implemented in any FPGA available from a given FPGA provider. Therefore, an FPGA that can more efficiently implement common user functions provides a marketing advantage over its competitors. Hence, efficient FPGA implementations of common functions are highly desirable.

One function often used in user designs is the multiplexing function. A user defines a circuit to be implemented in the FPGA using either schematic entry, where components are explicitly identified for placement in the design, or in a high-level design language (HDL), where the behavior of the circuit is described and synthesis software is used to identify components to be used in the circuit implementation. Regardless of which method is used to specify the design, the resulting circuit implementation is likely to include a large number of multiplexers.

Multiplexers are especially common in circuit netlists generated by synthesis software, and the use of synthesis software is increasing as user circuits increase in size. Therefore, an efficient multiplexer implementation is an increasingly desirable feature in an FPGA.

SUMMARY OF THE INVENTION

The invention provides novel structures for implementing wide multiplexers from user designs in FPGAs. Traditionally, wide multiplexers from user designs are implemented using common FPGA elements such as function generators and smaller dedicated multiplexers. On the other hand, existing input multiplexers (which provide data input signals to the function generators) are controlled solely by signals stored in configuration memory cells. Hence,.the existing input multiplexers are not available to implement wide multiplexers controlled by user control signals. According to the invention, the input multiplexers providing the function generator data input signals are modified to function under control of user signals. Thus, the input multiplexers of the invention are much more flexible than traditional input multiplexers.

A first aspect of the invention provides an FPGA configurable logic block (CLB) that includes: first and second bypass input multiplexers providing bypass signals from an FPGA general interconnect structure; a function generator with data input terminals; and a first data input multiplexer that provides signals from the general interconnect structure to one of the data input terminals of the function generator. (The terms"bypass input multiplexer" and"bypass multiplexer" are used herein to describe input multiplexers driving bypass input signals to the CLB, i.e., data input signals bypassing the function generator data input terminals. For example, in a Virtex or Virtex-II FPGA a bypass input signal BX or BY can drive the flip-flop directly, without passing through the function generator.) The first data input multiplexer includes a decoder circuit and a second stage multiplexer. The decoder circuit decodes user signals provided by the first and second bypass input multiplexers and provides control signals to select terminals of the second stage multiplexer. As directed by these control signals, the second stage multiplexer selects one of several values from the general interconnect structure and provides it to the function generator input terminal.

In one embodiment, the first data input multiplexer includes third multiplexers in addition to the second stage multiplexer. The third multiplexers are controlled by configuration data stored in configuration memory cells, in a manner similar to that of presently known input multiplexers.

In another embodiment, the second stage multiplexer is implemented as a group of pass transistors gated by logic gates. In one embodiment, the logic gates are controlled by both configuration memory cells and the control signals from the decoder circuit.

The data input multiplexer of the invention can be used on one, two, or more of the data input signals to the function generator. In one embodiment, the improved data input multiplexer is provided on two of four data input terminals of the function generator. In another embodiment, each data input terminal of the function generator uses an improved data input multiplexer according to the invention.

A second aspect of the invention provides a multiplexing input structure in an FPGA. The multiplexing input structure includes a first multiplexing circuit having data input terminals receiving user signals from the general interconnect structure, a select terminal receiving a bypass input signal also from the general interconnect structure, and an output terminal that drives one of the data input terminals of a CLB function generator.

In another embodiment, the multiplexing input structure includes second multiplexing circuits in addition to the first multiplexing circuit. The second multiplexing circuits are controlled by configuration data stored in configuration memory cells.

In another embodiment, the first multiplexing circuit is implemented as a group of pass transistors gated by logic gates. In one embodiment, the logic gates are controlled by both memory cells and the control signals from the decoder circuit.

According to a third aspect of the invention, an interconnect multiplexing circuit is provided that-can be used to drive signal lines in the general interconnect structure. The interconnect multiplexing circuit of the invention extends the concept of mixed memory cell and user control of a multiplexer presented herein into the general interconnect structure of an FPGA.

According to one embodiment, the invention provides an interconnect multiplexing circuit that includes a first multiplexing structure having data input terminals coupled to receive signals from the general interconnect structure, a first select terminal receiving a signal from a signal line in the general interconnect structure, a second select terminal receiving a signal from a configuration memory cell, and an output terminal that drives one of the signal lines making up the general interconnect structure.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
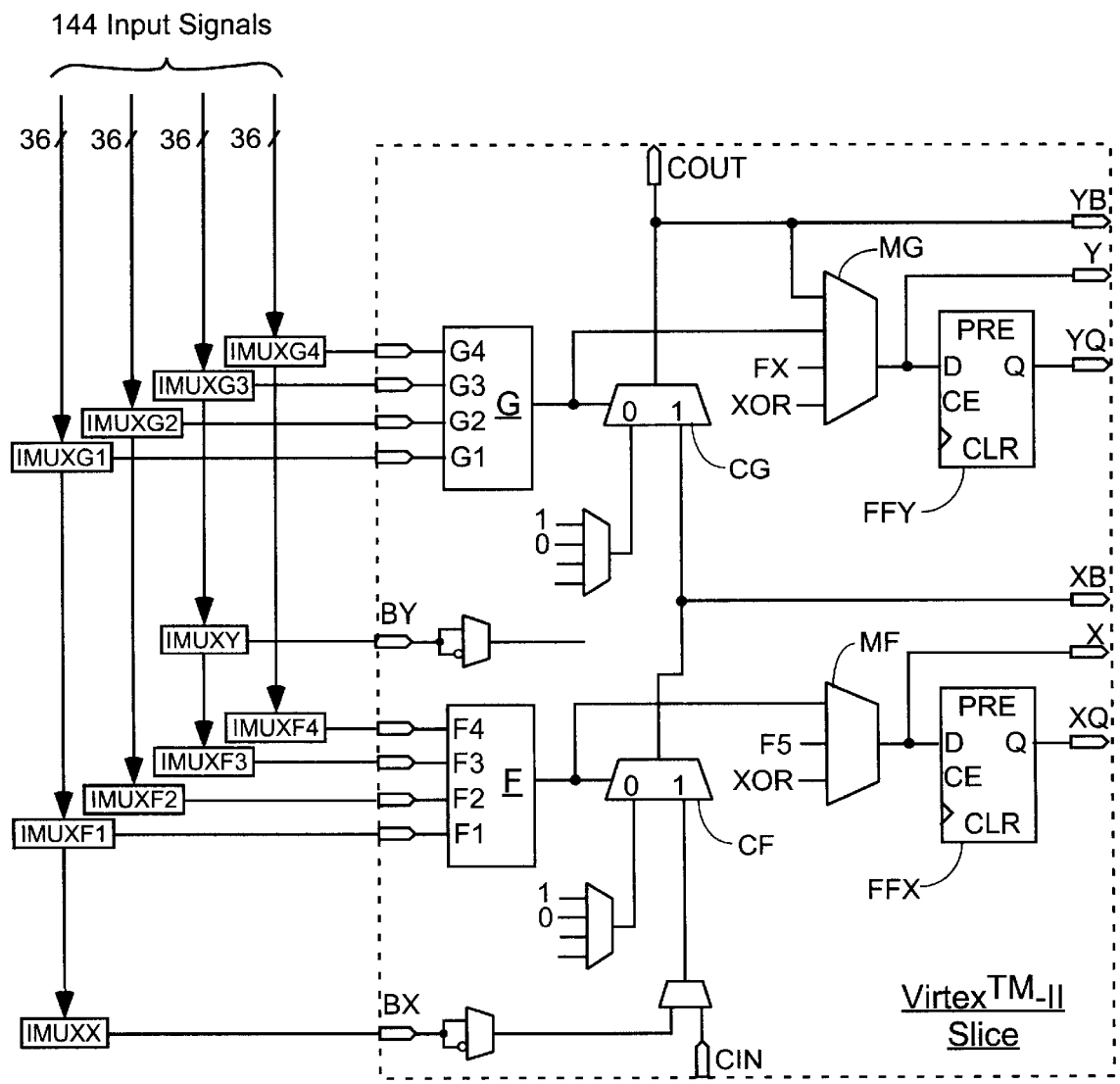
FIG. 1 is a simplified block diagram of a "slice" (a portion of a-Configurable Logic Block) from a Virtex™ or Virtex™-II FPGA, and the input multiplexers providing the input signals to the look-up tables (LUTs) of the slice.

FIG. 1 is a simplified block diagram showing a portion of a configurable logic block (CLB) in an FPGA. The CLB portion shown in the figure can be, for example, one "slice" of a Virtex™ or Virtex™-II FPGA, available from Xilinx, Inc. The Virtex and Virtex-II FPGA slices illustrated herein are selected merely as examples to show how the invention can be used, for example, to extend the functionality of existing FPGAs. The invention is not intended to be limited in application to these exemplary FPGAs.

A Virtex or Virtex-II slice includes two function generators F and G, two memory elements FFX and FFY, two multiplexers MF and MG, and two carry multiplexers CF and CG. Function generator F has four data input terminals F1–F4, and provides an output signal to a select terminal of carry multiplexer CF and to an input terminal of multiplexer MF. (In the present specification, the same reference characters are used to refer to terminals, signal lines, and their corresponding signals.) Multiplexer MF selects among input signals from function generator F, an F5 multiplexer (not shown in FIG. 1), and an XOR gate (not shown in FIG. 1), and provides an output signal to an output terminal X and to memory element FFX.

Similarly; function generator G has four data input terminals G1–G4, and provides an output signal to a select terminal of carry multiplexer CG and to an input terminal of multiplexer MG. Multiplexer MG selects among input signals from function generator G, an FX multiplexer (not shown in FIG. 1), an XOR gate (not shown in FIG. 1), and a carry out signal COUT, and provides an output signal to an output terminal Y and to memory element FFY.

Carry multiplexers CF and CG form a carry chain from a carry in terminal CIN to a carry out terminal COUT. Carry multiplexer CF selects between a high signal ("1"), a low signal ("0"), a bypass signal BX, the carry in signal CIN, and other signals (not shown), under control of the output signal from function generator F. Carry multiplexer CG selects between a high signal, a low signal, the output signal from carry multiplexer CF and other signals (not shown), under control of the output signal from function generator G. Carry multiplexer CG provides output signal COUT to a YB output terminal of the slice and also to the Y output terminal (through multiplexer MG).

Figure 1A:
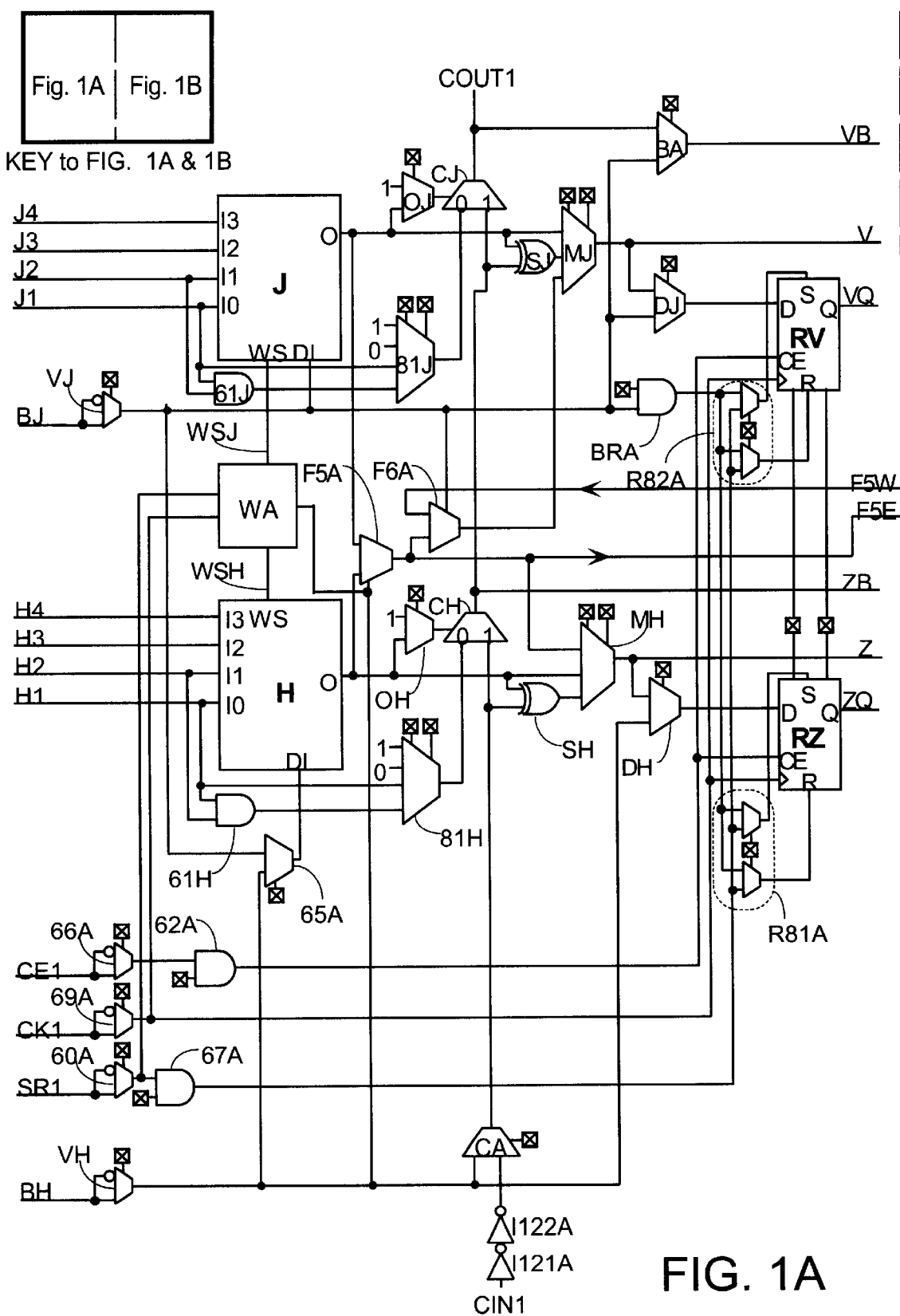
FIG. 1A schematically illustrates the left slice of a Virtex CLB, which comprises two slices.
Figure 1B:
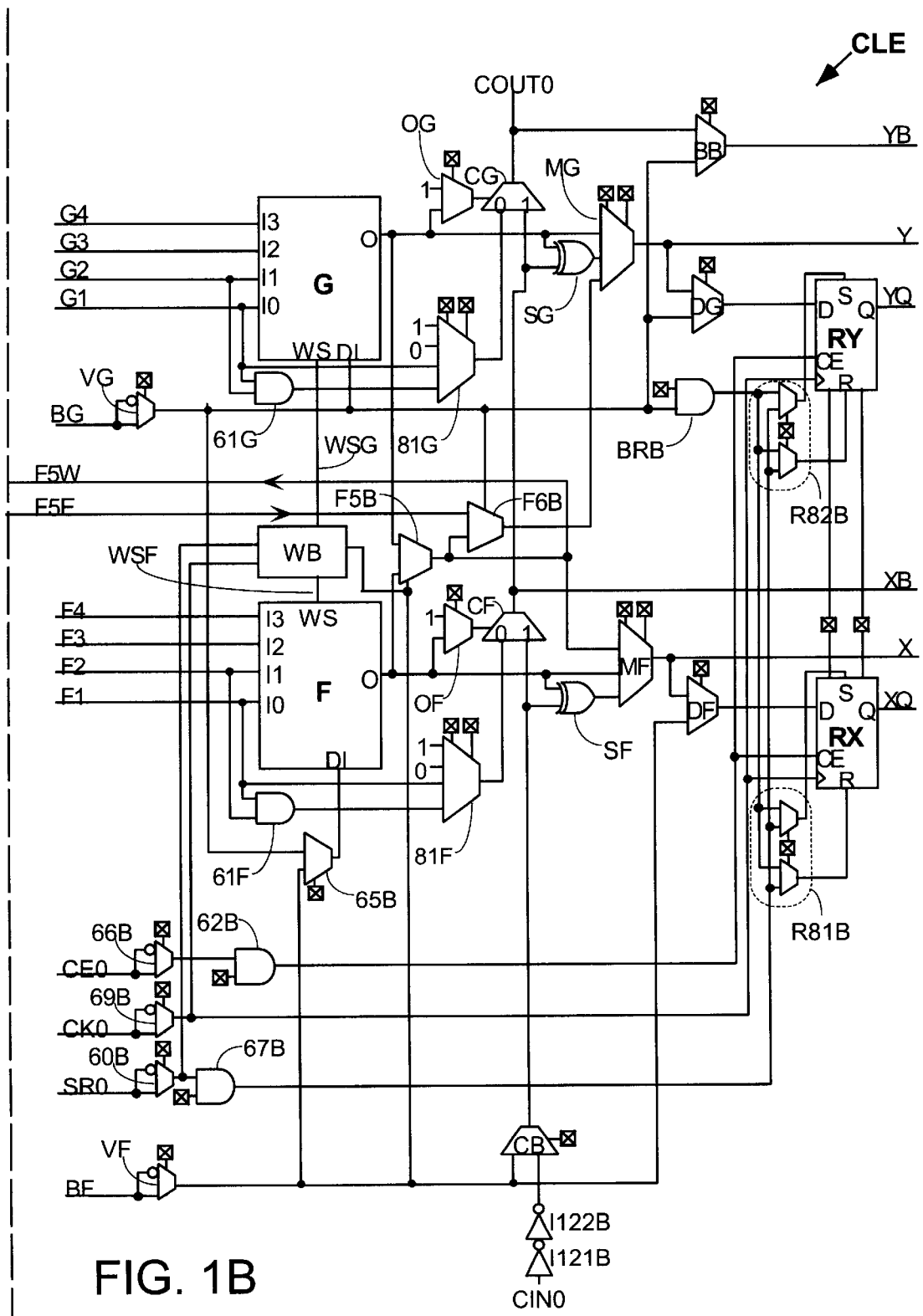
FIG. 1B schematically illustrates the right slice of a Virtex CLB.

Note that one of the input signals to carry multiplexer CF is a bypass input terminal. A "bypass input terminal," as the term is used herein, provides a user data signal that bypasses the function generator data input terminals (F1–F4, G1–G4) in the slice. Although each bypass signal BX, BY can optionally drive the "DI" input terminal of the corresponding function generator (see FIGS. 1A and 1B), the bypass signal is not provided to one of the four data input terminals (F1–F4, G1–G4) of the function generator. (The DI input terminals are specialized function generator input signals that are only used when the function generator is programmed to function as a RAM or a data shift register, not as the more general lookup table function. Therefore, the DI input terminals are not considered to be function generator data input terminals as the term is used in the present specification.) The bypass input signals BX and BY and their destinations within the CLB are shown in FIGS. 1A and 1B, where the signals appear as BF, BG, BH, and BJ.

A Virtex CLB includes two slices. A Virtex-II CLB includes four slices, each slice being similar (at the level of detail shown) to a Virtex slice. For simplicity, the smaller of these two CLBs (the Virtex CLB) is illustrated in FIGS. 1A and 1B. These figures show the slice in more detail than FIG. 1. For example, the F5 and FX function generators and their connections are shown. The F5 and FX function generators are discussed below with reference to FIG. 4.

The Virtex CLB is described by Young et al. in U.S. Pat. No. 5,920,202 and shown in FIGS. 4A and 4B therein. (U.S. Pat. No. 5,920,202 is hereby incorporated herein by reference.) These figures are reproduced in FIGS. 1A and 1B of the present specification. Young et al. describe the figures in detail, therefore, the description is not repeated here.

The Virtex FPGA is also described in pages 3–75 through 3–96 of the Xilinx 2000 Data Book entitled "The Programmable Logic Data Book 2000", published in April of 2000, available from Xilinx, Inc., 2100 Logic Drive, San Jose, Calif. 95124, which pages are incorporated herein by reference. The Virtex-II FPGA is described in pages 33–75 of the "Virtex™-II Platform FPGA Handbook", published in December of 2000, and also available from Xilinx, Inc. These pages are also incorporated herein by reference.

FIG. 1 also shows the interconnections between the slice and the general interconnect structure of the Virtex-II FPGA. Input signals from the general interconnect structure (labeled "144 Input Signals" in FIG. 1) are provided to input multiplexers IMUXG1–IMUXG4, IMUXF1–IMUXF4, IMUXY, and IMUXX. Each of input multiplexers IMUXG1–IMUXG4 and IMUXF1–IMUXF4 selects one of 36 input signals and provides the selected signal to a data input terminal of one of the function generators. Bypass input multiplexers IMUXY and IMUXX each select one of 32 input signals and provide one of the signals to a bypass input terminal of the CLB. The selection is made under the control of values stored in configuration memory cells, as shown in FIG. 2.

Figure 2:
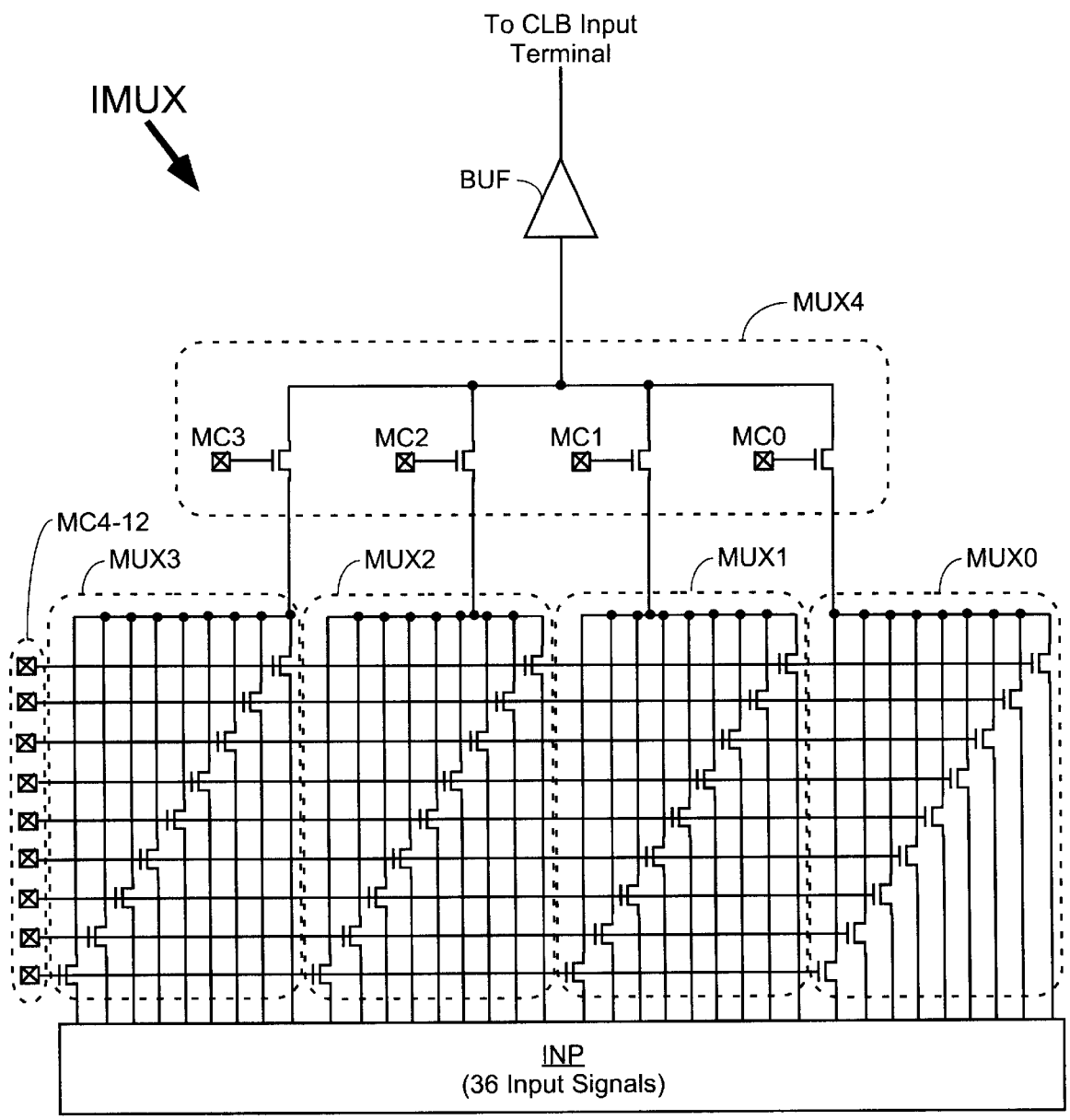
FIG. 2 is a schematic diagram of one input multiplexer IMUX from the slice pictured in FIG. 1.

FIG. 2 shows a prior art implementation of an input multiplexer IMUX from FIG. 1. This implementation is used, for example, in a Virtex-II CLB to drive the function generator data input terminals. Thus, input multiplexer IMUX of FIG. 2 corresponds to multiplexers IMUXG1–IMUXG4 and IMUXF1–IMUXF4 in FIG. 1.

Input multiplexer IMUX includes four 9-to-1 multiplexers MUX0–MUX3, a 4-to-1 multiplexer MUX4, configuration memory cells MC0-MC3 driving the select terminals of multiplexer MUX4, and configuration memory cells MC4-MC12 driving the select terminals of multiplexers MUX0–MUX3. Multiplexers MUX0–MUX3 each select one of nine input signals, of which eight are supplied (via the general interconnect structure) by other sources within the FPGA and of which one is a feedback signal routed back from an output terminal of the same CLB. The four output signals from multiplexers MUX0–MUX3 are provided to multiplexer MUX4, which selects one of the four signals as the IMUX output signal. The selected signal is buffered in buffering circuit BUF and applied to a data input terminal of the corresponding function generator. Buffer BUF can include (in addition to other circuitry) one or more inverters, i.e., it can be inventing or non-inverting.

Note that the entire multiplexing structure of multiplexer IMUX is controlled by values stored in configuration memory cells MC0–MC12. Thus, this structure cannot be used to implement any multiplexing function where one or more select signals are user control signals (i.e., signals in the user circuit that change value during the operation of the user circuit).

Figure 3:
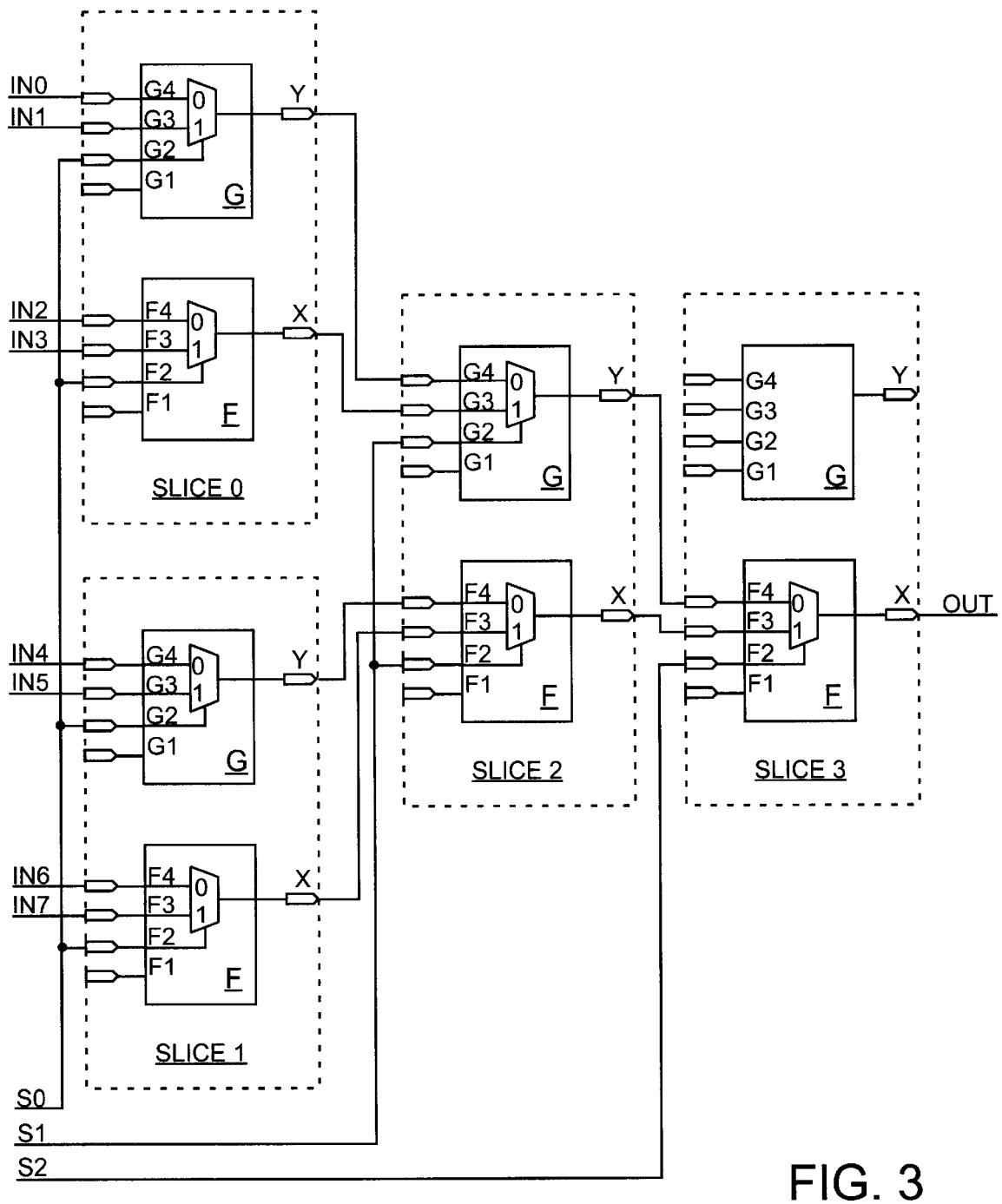
FIG. 3 shows how an 8-to-1 multiplexer is traditionally implemented in an FPGA using 4-input LUTs.

FIG. 3 shows a first well-known implementation of an 8-to-1 multiplexer in an FPGA. The 8-to-1 multiplexer is shown as an exemplary wide multiplexer that can be implemented in an FPGA. However, the structures of the invention can be used to implement multiplexers both wider and narrower than the 8-to-1 multiplexer. Table 1 is a truth or the exemplary 8-to-1 multiplexers of FIGS. 3–5.

TABLE 1

| Select Signals | | | Output Signal |
| --- | --- | --- | --- |
| S2 | S1 | S0 | OUT |
| 0 | 0 | 0 | IN0 |
| 0 | 0 | 1 | IN1 |
| 0 | 1 | 0 | IN2 |
| 0 | 1 | 1 | IN3 |
| 1 | 0 | 0 | IN4 |
| 1 | 0 | 1 | IN5 |
| 1 | 1 | 0 | IN6 |
| 1 | 1 | 1 | IN7 |

The 8-to-1 multiplexer of FIG. 3 is implemented using function generators to implement all multiplexing logic. The function generators of a typical FPGA are implemented as 4-input lookup tables (LUTs) and can provide any function of up to four inputs. Therefore, one function generator can be used to implement one 2-to-1 MUX.

As shown in FIG. 3, an 8-to-1 multiplexer can be implemented as seven 2-to-1 multiplexers. A first stage (implemented in Slices 0 and 1 in FIG. 3) reduces the number of input signals from eight to four using four 2-to-1 multiplexers. A second stage (implemented in Slice 2 in FIG. 3) reduces the number of input signals from four to two using two 2-to-1 multiplexers. A third stage (implemented in half of Slice 3 in FIG. 3) reduces the number of input signals from two to one using a single 2-to-1 multiplexer.

The implementation of an 8-to-1 multiplexer shown in FIG. 3 consumes 7 function generators (three and a half slices) and imposes a delay of three levels of logic on the output signal OUT.

Figure 4:
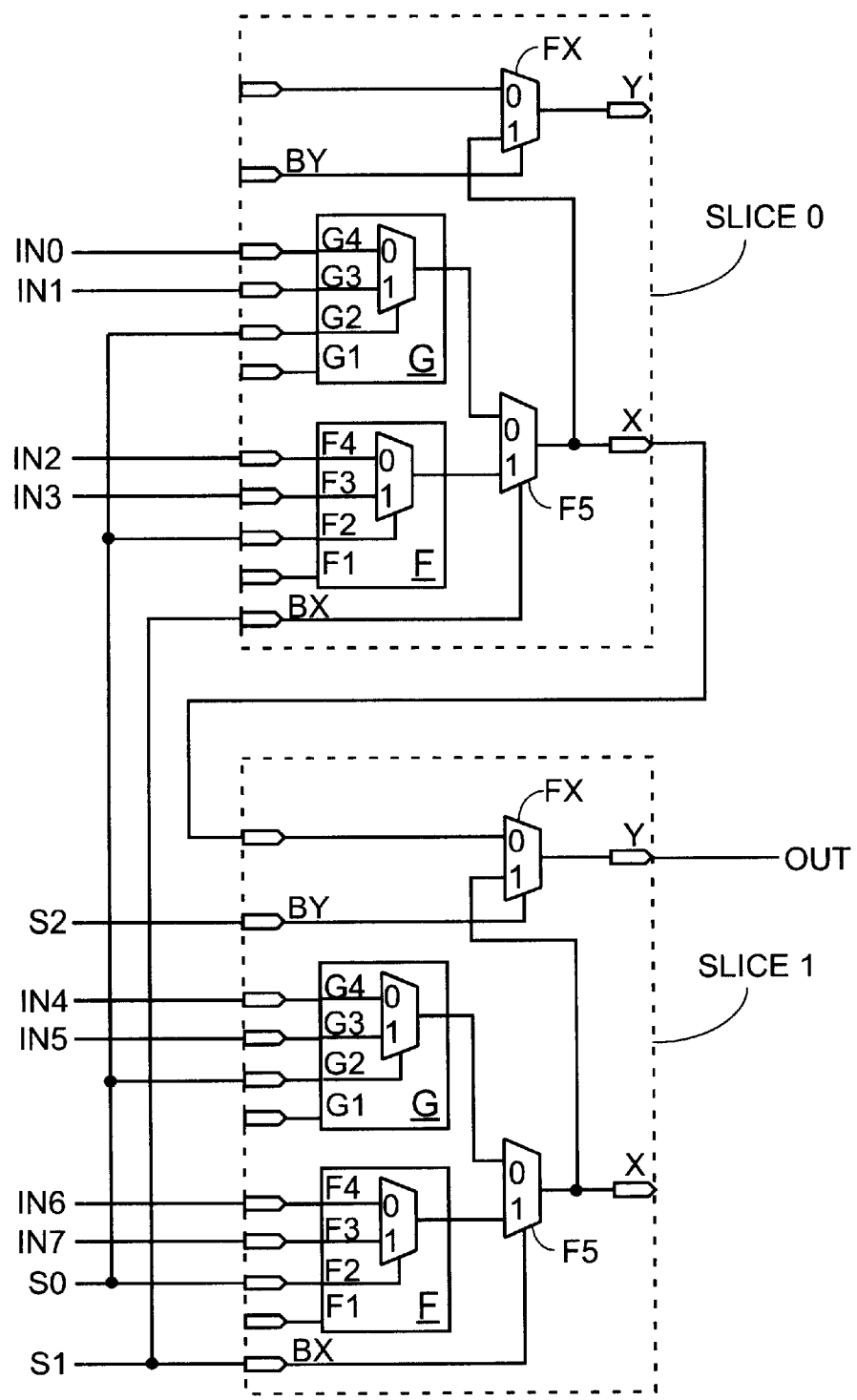
FIG. 4 shows how an 8-to-1 multiplexer can be implemented using the "F5" and "FX" function generators included in the CLBs of the Virtex-II FPGA.

FIG. 4 shows a second well-known implementation of an 8-to-1 multiplexer in an FPGA. This implementation makes use of the F5 and FX multiplexers that were previously referenced in regard to FIGS. 1A and 1B.

The F5 multiplexer in each slice combines the output signals from the F and G function generators in a 2-to-1 multiplexer, under control of the bypass input signal BX. The FX multiplexer combines the output signal from the associated F5 multiplexer with the output of another multiplexer from another slice. The F5 and FX multiplexers in the Virtex CLB are shown and described in U.S. Pat. No. 5,920,202, which is incorporated herein by reference. The F5 and FX multiplexers in the Virtex-II CLB are shown on page 52 of the "Virtex™-II Platform FPGA Handbook", referenced above.

As shown in FIG. 4, the F and G function generators of two slices are used (under control of select signal S0) to reduce the number of input signals from eight to four. The F5 multiplexer in each slice is then used (under control of select signal S1 applied to the BX bypass input terminal of each slice) to reduce the four signals to two. The two signals are then reduced to one signal using the FX multiplexer of one slice, under control of the S2 control signal applied to the BY bypass input terminal.

The implementation of an 8-to-1 multiplexer shown in FIG. 4 consumes four function generators (two slices) and imposes a delay of about two levels of logic on the output signal OUT, assuming that each F5, FX multiplexer has about half the delay of a function generator.

Figure 5:
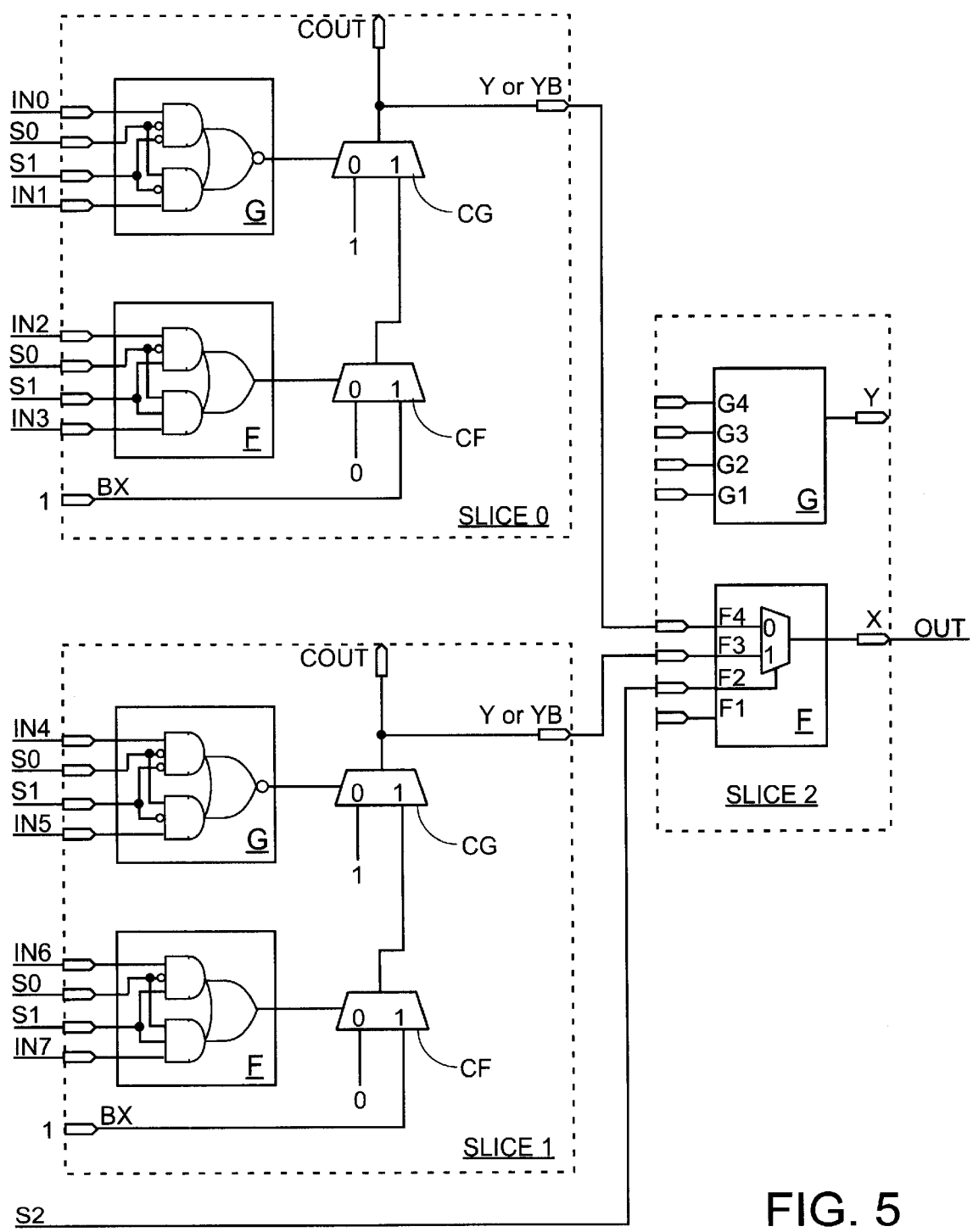
FIG. 5 shows another way in which an 8-to-1 multiplexer can be implemented in the FPGA of FIG. 1, using the LUTs and the carry chain.

FIG. 5 shows a third possible implementation of an 8-to-1 multiplexer in an FPGA. This implementation uses the CLB carry chain to implement some of the functionality of the multiplexer, thus reducing both the FPGA resource usage and the number of logic levels in comparison to the implementation of FIG. 3.

In the implementation of FIG. 5, the CF carry multiplexer implements a direct logical connection between the select-terminal and the output terminal. The CG carry multiplexer implements an OR function between the signal on the "1" data input terminal and the inverse of the signal on the select terminal.

Thus, the eight input signals are reduced to four signals in the four function generators of Slices 0 and 1. The four signals are reduced to two signals through the carry chains of the two slices. The S2 select signal is then used to select between the two remaining signals in a fifth function generator in Slice 2.

The implementation of an 8-to-1 multiplexer shown in FIG. 5 consumes 5 function generators (two and a half slices) and imposes a delay of two and a half levels of logic on the output signal OUT, assuming the carry chain has about half the delay of a function generator, per slice.

FIGS. 3–5 illustrate three different implementations of an 8-to-1 multiplexer that can be executed in an existing and commercially available FPGA. Each of the three implementations requires several function generators to implement, and each includes at least two levels of logic to delay the output signal, as shown in Table 2.

A first embodiment of the invention provides a modification to the input multiplexer structure of existing FPGAs. This modification allows the implementation of an 8-to-1 multiplexer in a single function generator, with a single function generator delay plus a little additional delay (shown as a total of about 1.25 logic levels in Table 2). Larger multiplexers have similar relative savings in FPGA resources and signal delays.

TABLE 2

|  | LUT-based (FIG. 2) | F5/FX (FIG. 3) | Carry Chain (FIG. 4) | Invention (1st Emb.) |
| --- | --- | --- | --- | --- |
| Function Generators | 7 | 4 | 5 | 1 |
| Logic Levels | 3 | 2 | 2.5 | 1.25 |

Figure 6:
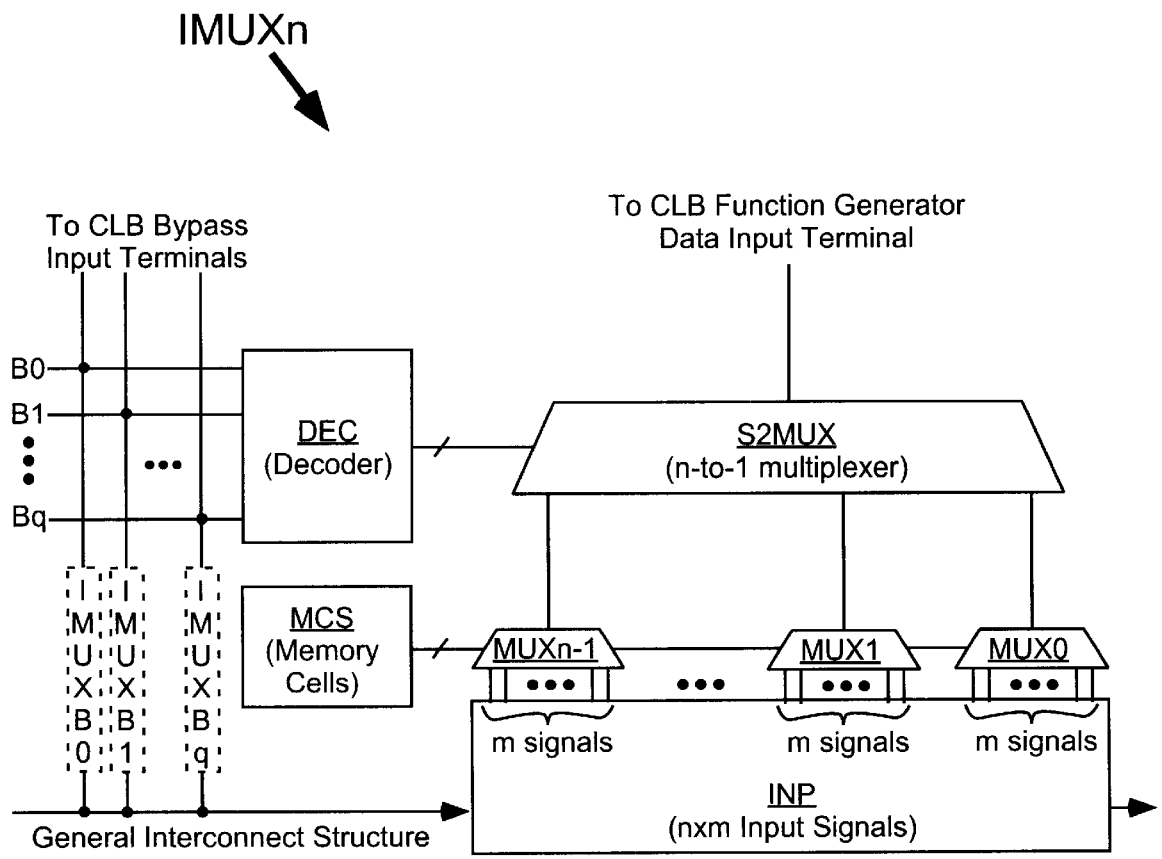
FIG. 6 is a schematic diagram of a first novel input multiplexer IMUXn that can be used with an FPGA CLB (e.g., with the slice of FIG. 1) to provide added multiplexing capability, according to a first embodiment of the invention.

FIG. 6 shows an input multiplexer IMUXn according to a first embodiment of the invention. Input multiplexer IMUXn can be used, for example, to add functionality and flexibility to the slice of FIG. 1. Input multiplexer IMUXn includes a decoder DEC, a group MCS of configuration memory cells, a group of n multiplexers MUX0–MUXn–1, and a second stage multiplexer S2MUX.

A group of-input terminals INP provides nxm input signals from the general interconnect structure. Each of the n multiplexers MUX0–MUXn–1 accepts m input signals from the input terminals INP, and selects one of the m input signals under the control of values stored in the memory cells MCS. The selected values are passed to n-to-1 multiplexer S2MUX, which selects one of the signals under the control of the decoder circuit DEC. The selected signal is passed to a data input terminal of one of the CLB function generators.

The general interconnect structure also passes bypass input signals B0–Bq to the decoder. In one embodiment, bypass input signals B0–Bq are selected from the general interconnect structure using multiplexers IMUXB0–IMUXBq. In one embodiment, multiplexers IMUXB0–IMUXBq are similar to multiplexers IMUXFi, IMUXGi, IMUXX, or IMUXY shown in FIG. 1. In these embodiments, multiplexers IMUXB0–IMUXBq are controlled by values stored in configuration memory cells (not shown).

Bypass input signals B0–Bq are also provided to the bypass input terminals of a CLB, which can be the same CLB that includes the function generator driven by multiplexer IMUXn, or can be a different CLB. In one embodiment, the bypass input terminals and the function generator data input terminal are in the-same slice. In another embodiment, the bypass input terminals and the function generator data input terminal are in different slices.

Bypass multiplexers IMUXB0–IMUXBq are not included in input multiplexer IMUXn in this embodiment, rather, they are implemented separately from multiplexer IMUXn. Therefore, multiplexers IMUXB0–IMUXBq are drawn using a dotted line in FIG. 6.

A comparison of FIGS. 6 and 2 reveals that the input multiplexer of the invention differs from prior art input multiplexers in that the multiplexer stages are not controlled simply by configuration memory cells. Instead, a combination of configuration memory cells and user signals from the general interconnect structure is used. Thus, input multiplexer IMUXn (from FIG. 6) can be used to implement wide multiplexers from a user's circuit that are controlled by user signals, while input multiplexer IMUX (from FIG. 2) cannot.

In another embodiment, the multiplexers controlled by configuration memory cells (MUX0–MUXn–1) are omitted from input multiplexer IMUX8. However, this embodiment reduces the usefulness of the CLB in implementing logic other than wide multiplexers. Thus, the input multiplexer with "mixed sources" for the select signals, as shown in FIG. 6, is preferred.

Figure 7:
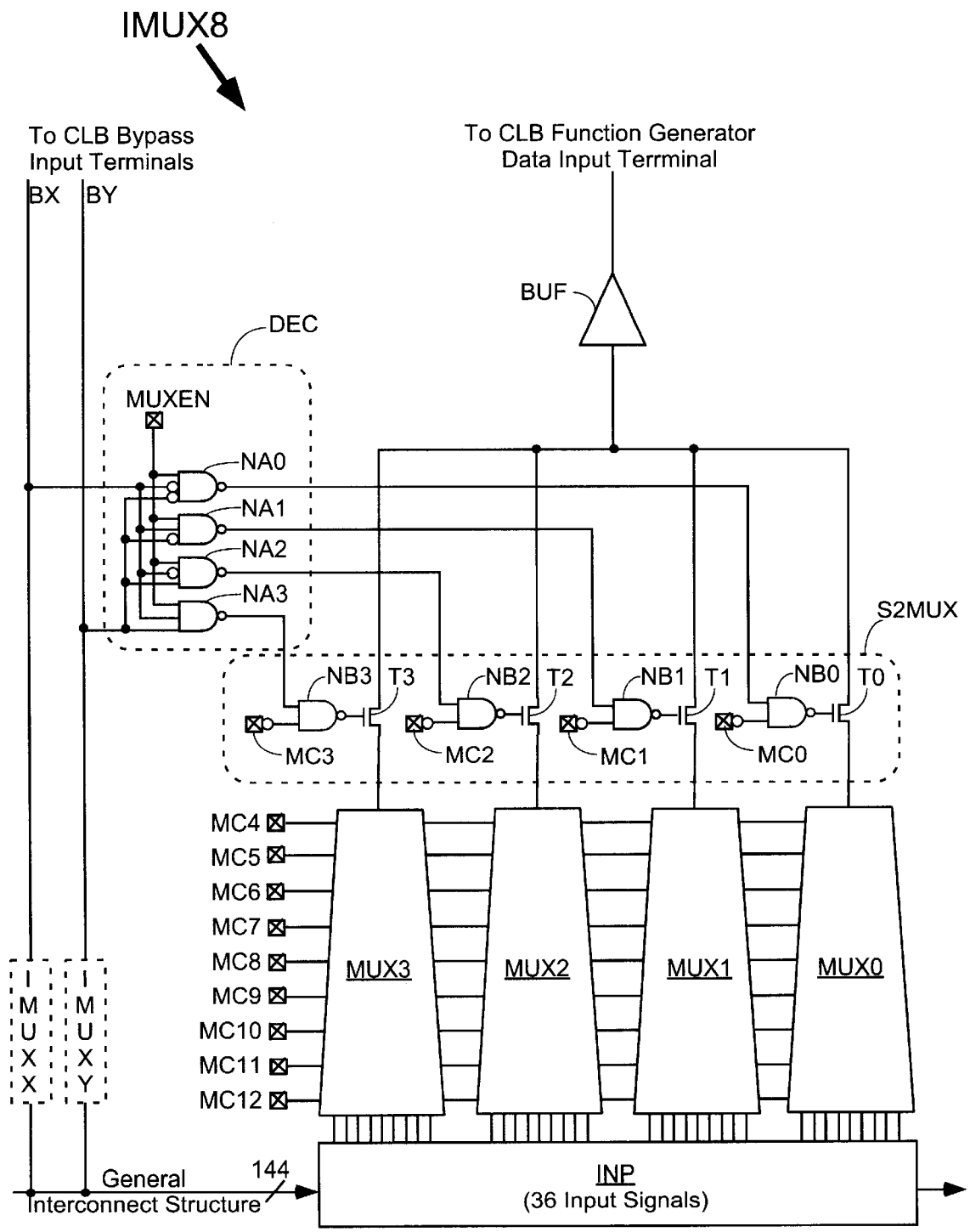
FIG. 7 is a schematic diagram of a second novel input multiplexer IMUX8 that can be used with an FPGA CLB (e.g., with the slice of FIG. 1) to provide added multiplexing capability, according to a second embodiment of the invention.

FIG. 7 shows a second input multiplexer IMUX8 according to a second embodiment of the invention. Multiplexer IMUX8 is one implementation of multiplexer IMUXn of FIG. 6. The name "IMUX8" was selected for-this implementation because in one embodiment (shown in FIG. 8), multiplexer IMUX8 is included in an FPGA that easily implements swift and efficient 8-to-1 multiplexers using a single function generator.

Comparing FIGS. 7 and 6, in input multiplexer IMUX8 m is nine, n is four, and q is one. Each of multiplexers MUX0–MUX3 is a 9-to-1 multiplexer, accepting from the general interconnect structure eight signals from other CLBs or other slices and one feedback signal from an output terminal (not shown) of the same CLB. One of these nine signals is selected by each multiplexer MUX0–MUX3 under control of values stored in configuration memory cells MC4–MC12. Each of the selected values is passed to second stage multiplexer S2MUX.

Bypass signals BX and BY are provided from the general interconnect structure to the decoder circuit DEC via bypass multiplexers IMUXX and IMUXY, respectively. Decoder DEC decodes the bypass signals BX and BY using four NAND gates NA0–NA3, to provide four select signals to the second stage multiplexer S2MUX. Multiplexer enable memory cell MUXEN provides a third input signal (also called MUXEN) to each of NAND gates NA0–NA3. When enable signal MUXEN is high, the decoder functions to decode bypass signals BX and BY and control second stage multiplexer S2MUX. When enable signal MUXEN is low, each of NAND gates NA0–NA3 provides a high output signal, and decoder circuit DEC is not a factor in controlling second stage multiplexer S2MUX. Therefore, when enable signal MUXEN is low, input multiplexer IMUX8 functions the same as the prior art input multiplexer of FIG. 2.

In the embodiment of FIG. 7, second stage multiplexer S2MUX is implemented as a group of N-channel pass transistors T0-T3 coupled between each data input terminal and an internal node. Each pass transistor is controlled by a logic gate, in this embodiment a NAND gate. Each of NAND gates NB0–NB3 has two input terminals, one coupled to the output of a corresponding NAND gate NA0–NA3 and the other coupled to a corresponding configuration memory cell MC0–MC3.

Thus, when one of NAND gates NA0–NA3 provides a high signal, the condition of the corresponding pass transistor (e.g., on or off) is controlled by the value in the corresponding configuration memory cell. When one of NAND gates NA0–NA3 provides a low signal, the corresponding pass transistor is turned on, and the signal from the corresponding data input terminal is passed to the internal node.

Thus, when multiplexer input signal MUXEN is high (enabled), each of memory cells MC0–MC3 is programmed to provide a zero value. Because of the "bubble" on the memory cell outputs, each memory cell provides a high value to the corresponding NAND gate NB0–NB3. Decoder DEC thus completely controls second stage multiplexer S2MUX.

Coupled between the internal node and the function generator data input terminal is a buffer circuit BUF. Buffer circuits are well known in the art, therefore, they are not described in detail here.

Figure 7A:
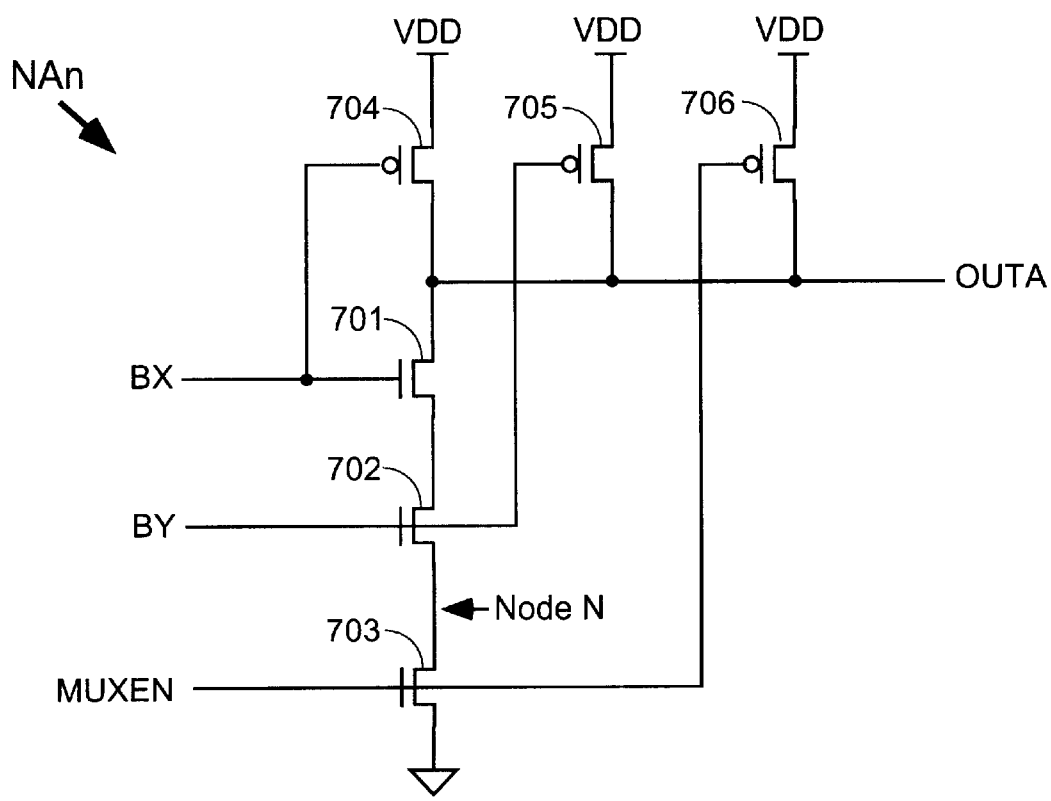
FIG. 7A shows a first NAND-gate that can be used with the embodiment of FIG. 7.

FIG. 7A illustrates one embodiment NAn of NAND gates NA0–NA3 of FIG. 7. The circuit of FIG. 7A is a standard 3-input NAND gate implementation. The three input signals BX, BY, and MUXEN (of which signals BX and BY are sometimes inverted) drive N-channel transistors 701–703 coupled in series between the output node OUTA and ground. The three input signals also drive P-channel transistors 704–706 coupled in parallel between node OUTA and power high VDD.

In one embodiment, node N is shared between all of NAND gates NAn, and only one transistor 703 is used in all of NAND gates NAn. Transistor 706 can also be of smaller size than the other transistors. Being driven by a value determined at the time of configuration (MUXEN), the speed of this transistor is not important.

Figure 7B:
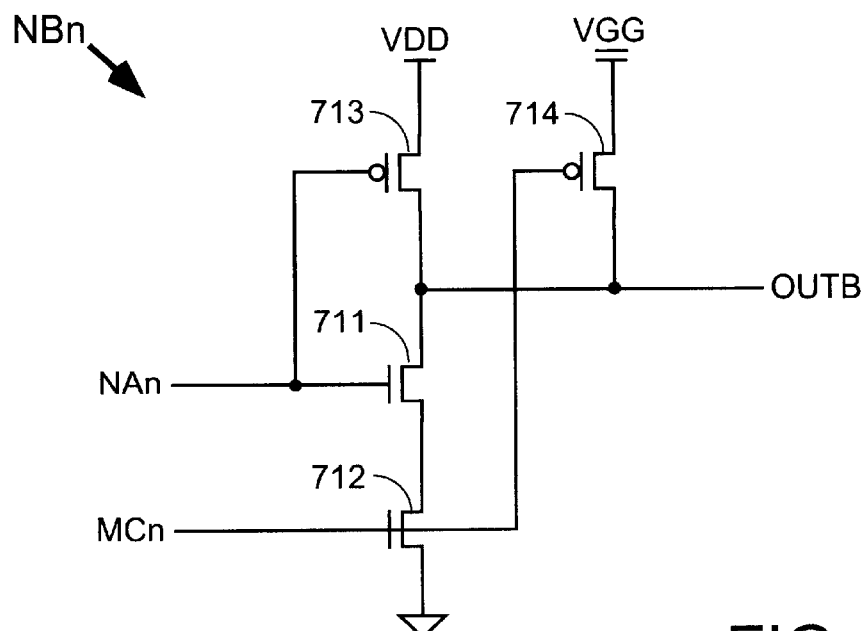
FIG. 7B shows a second NAND-gate that can be used with the embodiment of FIG. 7.

FIG. 7B illustrates one embodiment NBn of NAND gates NB0–NB3 of FIG. 7. With one exception, the circuit of FIG. 7B is a standard 2-input NAND gate implementation. Two input signals NAn and MCn drive N-channel transistors 711 and 712 coupled in series between the output node OUTB and ground. The two input signals also drive P-channel transistors 713 and 714, each coupled between node OUTB and a power high.

However, note that in this embodiment transistor 714 is coupled between output node OUTB and a power high value of VGG, rather than VDD. In one embodiment, power high VGG has a voltage level fifteen percent high than the voltage level of power high VDD. In this embodiment, configuration memory cells MC0–MC12 also use power high VGG rather than VDD.

The reason for this voltage elevation is that output node OUTB drives the gate terminal of an N-channel pass transistor (i.e., transistors T0-T3 in FIG. 7). An N-channel pass transistor is faster in passing a high value if the gate of the transistor is at a voltage level higher than the high level passed through the pass transistor.

Referring again to FIG. 7B, because a high value on signal MCn is at a voltage high level of VGG, transistor 714 must also be tied to VGG. Otherwise, a low value on signal MCn may not be sufficient to completely turn off transistor 714, and leakage can occur.

Figure 8:
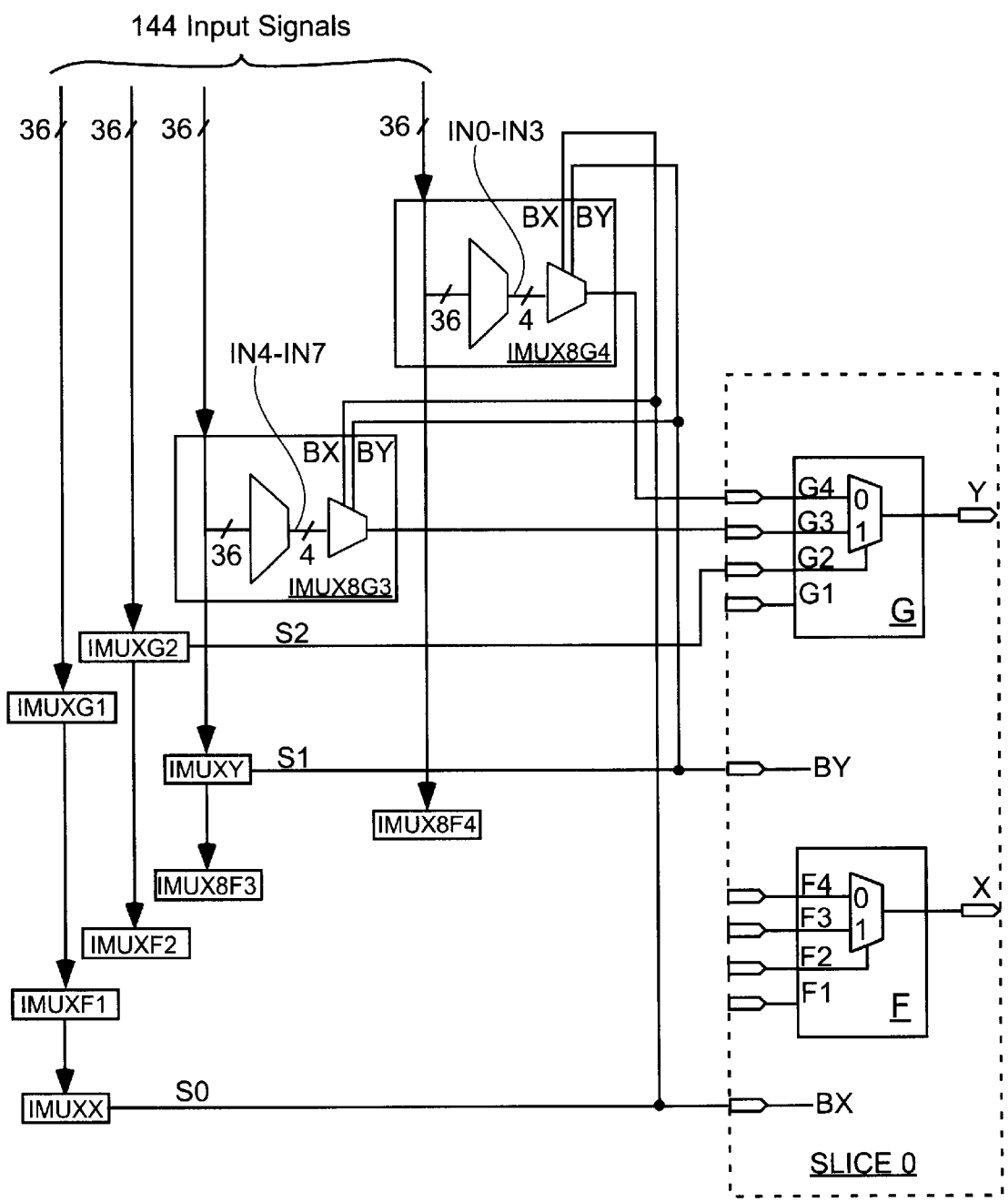
FIG. 8 shows how the input multiplexer of FIG. 7 can be used in a Virtex-II slice to implement an 8-to-1 multiplexer included in a user circuit.

FIG. 8 shows one embodiment of an FPGA CLB, in which input multiplexer IMUX8 of FIG. 7 is used to provide additional input flexibility to two data input terminals of each function generator. For example, for function generator G, data input terminals G4 and G3 are driven by input multiplexers IMUX8 (designated IMUX8G4 and IMUX8G3, respectively, in FIG. 8). Data input terminals G2 and G1, however, are still driven by input multiplexers IMUX (see FIG. 2). Providing the enhanced input multiplexers on only two of four data input terminals saves silicon area, while still enabling the efficient implementation of 8-to-1 multiplexers using the input multiplexer structure of FIG. 7 and a single function generator G.

Data input terminals G4 and G3 were selected for enhancement in this embodiment, because they were the two fastest input terminals. By selecting the two fastest data input terminals for enhancement, the path through the enhanced input multiplexer is made as fast as possible. Note that if the additional multiplexer capability provided by the invention is not used, there is no adverse effect on the speed of the input path, because the decoder logic is not on the critical path through the input multiplexer.

As shown in FIG. 8, an 8-to-1 multiplexer can now be implemented using a single function generator. The second stage multiplexer in input multiplexer IMUX8G4 selects one of the four input signals IN0–IN3. The second stage multiplexer in input multiplexer IMUX8G3 selects one of the four input signals IN4–IN7. A 2-to-1 multiplexer is then implemented in function generator G, using the select signal S2 to select the final output signal for the 8-to-1 multiplexer.

The implementation of an 8-to-1 multiplexer shown in FIG. 8 consumes one function generator (half a slice) and imposes-a delay of slightly more than one level of logic on the output signal OUT.

Figure 9:
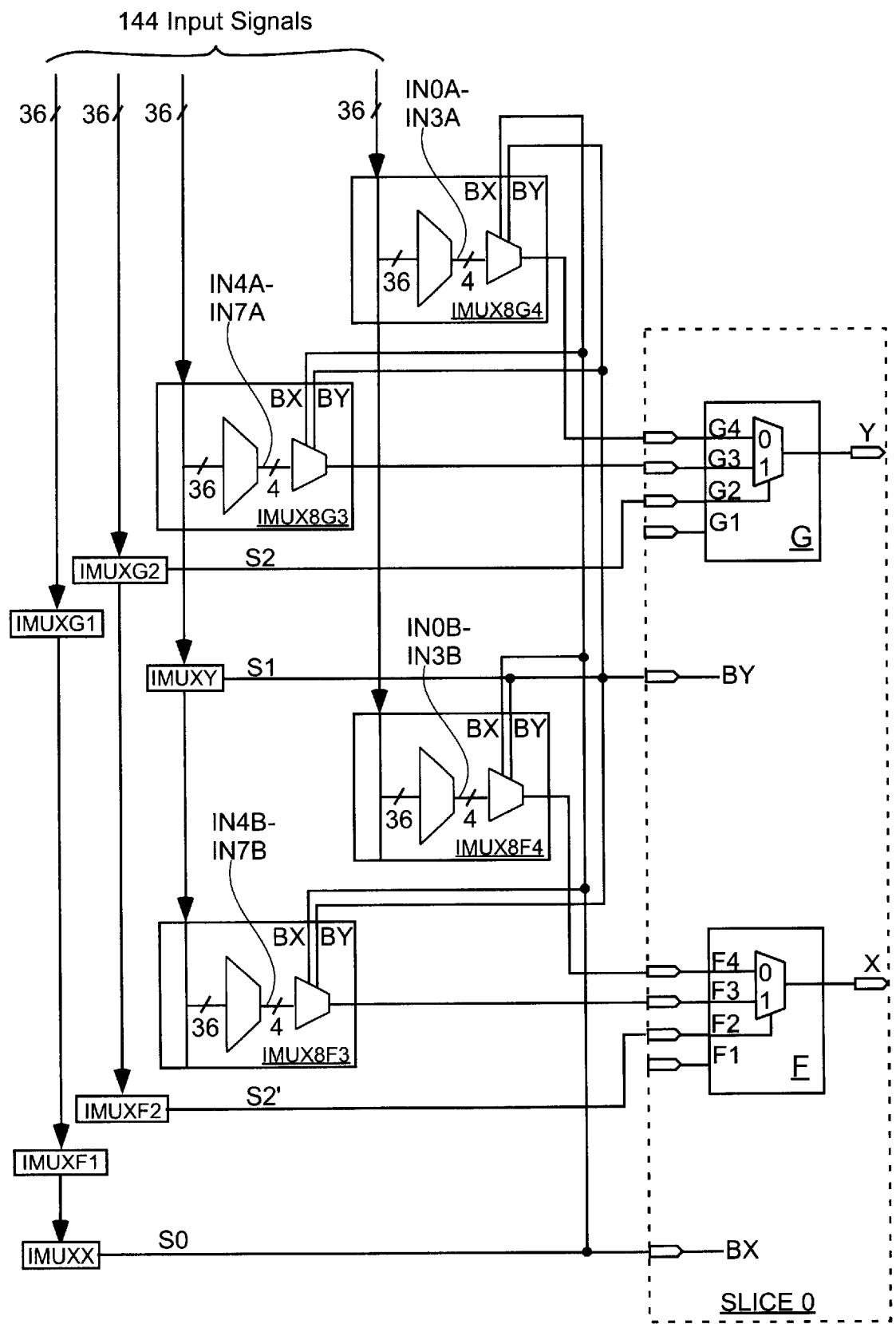
FIG. 9 shows how the input multiplexer of FIG. 7 can be used in a Virtex-II slice to implement two related 8-to-1 multiplexers in a single such slice.

As shown in FIG. 9, a single CLB slice can be used to implement two 8-to-1 multiplexers, but only if they share two out of three select signals. In other words, if select signal S0 is provided on bypass terminal BX, and select signal S1 is provided on bypass terminal BY, then both 8-to-1 multiplexers must share these two select signals. However, the S2 select signal can be different, if desired, for each of the two 8-to-1 multiplexers. Multiplexers having shared select signals are very common in datapath-related applications.

In other embodiments (not shown), the two bypass signals driving the enhanced input multiplexer are two BX bypass signals from two different slices, two BY bypass signals from two different slices, or a BX bypass signal from one slice and a BY bypass signal from another slice.

Figure 10:
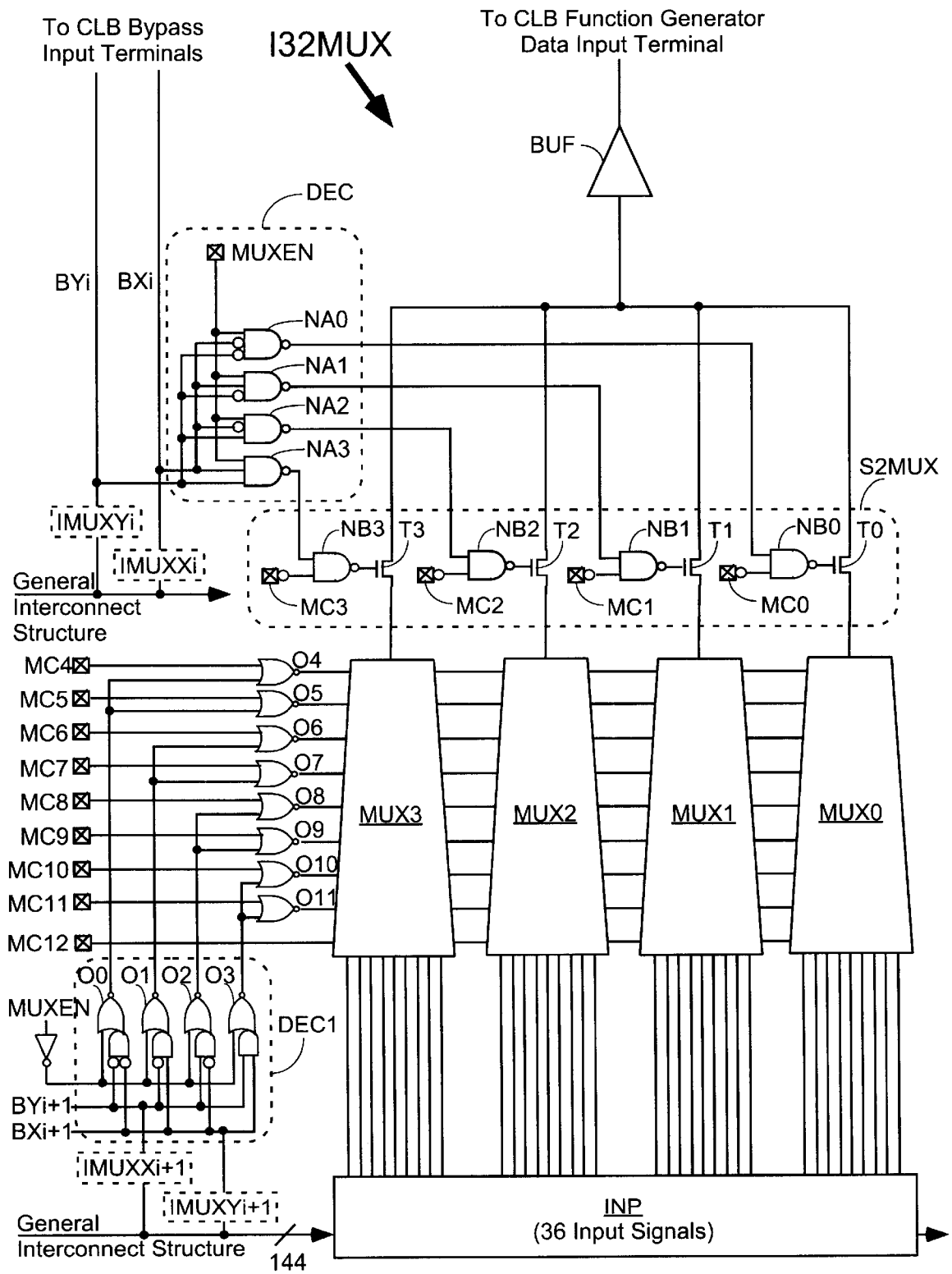
FIG. 10 is a schematic diagram of a third novel input multiplexer I32MUX that can be used with an FPGA CLB (e.g., with the slice of FIG. 1) to provide yet more multiplexing capability, according to a third embodiment of the invention.

FIG. 10 shows a third input multiplexer I32MUX according to a third embodiment of the invention. Portions of multiplexer I32MUX are similar to multiplexer IMUX8 of FIG. 7. Therefore, elements in the drawing that are similar to corresponding elements in FIG. 7 are not further described here.

Input multiplexer I32MUX includes another level of multiplexing compared to input multiplexer IMUX8 of FIG. 7. The bypass signals from the adjacent slice (BXi+1 and BYi+1) are also used to generate multiplexer select signals, being decoded in decoder DEC1. Decoder DEC1 includes four AND-NOR gates O0–O3. AND-NOR gates O0–O3 are controlled by the inverse of multiplexer enable signal MUXEN, such that bypass signals BXi+1 and BYi+1 are ignored when signal MUXEN is low. When multiplexer enable signal MUXEN is high, the decoded bypass signals are combined with the output signals from memory cells MC4–MC11 in OR gates O4–O11. The ninth select signal for multiplexers MUX0–MUX3, provided by memory cell MC12, is unchanged.

As described with reference to FIG. 7, when multiplexer input signal MUXEN is high (enabled), each of memory cells MC0–MC3 is programmed to provide a zero value. The embodiment of FIG. 10 includes a second decoder DEC1. When multiplexer input signal MUXEN is high (enabled), memory cells MC4–MC11 are programmed to provide alternating high and low values (e.g., MC4 can be high, MC5 can be low, etc.). Thus, only half of NOR gates O4–O11 are controlled by the decoder outputs. When multiplexer input signal MUXEN is low (disabled), input multiplexer I32MUX functions the same as the prior art input multiplexer of FIG. 2.

Figure 10A:
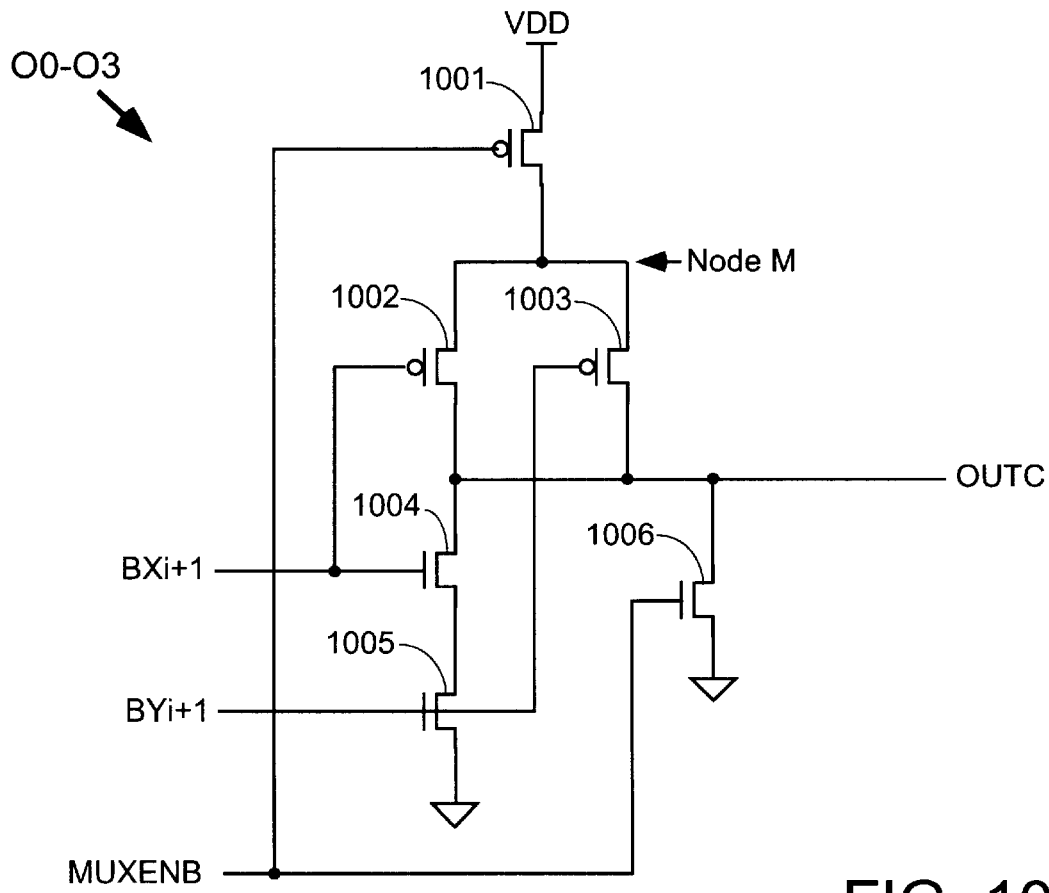
FIG. 10A shows a first AND-NOR gate that can be used with the embodiment of FIG. 10.

FIG. 10A shows one embodiment of AND-NOR gates O0–O3 of FIG. 10. The circuit of FIG. 10A is a standard AND-NOR gate implementation. The two input signals BXi+1 and BYi+1 (which are sometimes inverted) drive N-channel transistors 1004 and 1005 coupled in series between the output node OUTC and ground. The two input signals also drive P-channel transistors 1002 and 1003 coupled in parallel between output node OUTC and internal node M. Signal MUXENB (the inverse of multiplexer enable signal MUXEN) drives N-channel transistor 1006 coupled between output node OUTC and ground, and also drives P-channel transistor 1001 coupled between node M and power high VDD.

In one embodiment, node M is shared between all of AND-NOR gates O0–O3, and only one transistor 1001 is used in all of AND-NOR gates O0–O3. Transistor 1006 can also be of smaller size than the other transistors. Being driven by a value determined at the time of configuration (MUXENB), the speed of this transistor is not important.

Figure 10B:
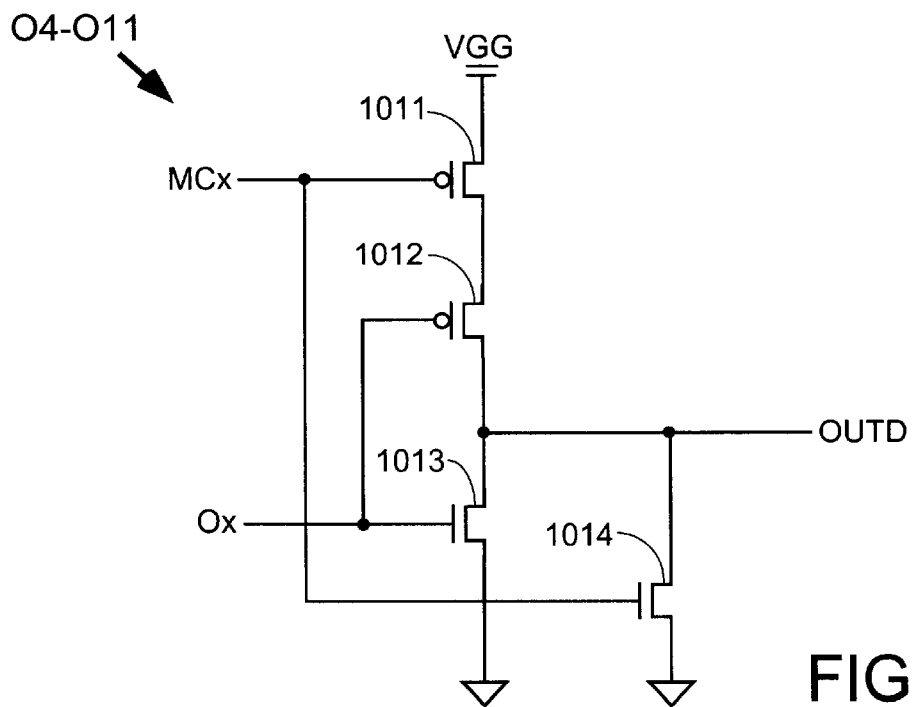
FIG. 10B shows a first NOR-gate that can be used with the embodiment of FIG. 10.

FIG. 10B illustrates one embodiment of NOR gates O4-O11 of FIG. 10. With one exception, the circuit of FIG. 10B is a standard 2-input NOR gate implementation. Two input signals MCx and Ox drive N-channel transistors 1014 and 1013, respectively, coupled in series between the output node OUTD and ground. Input signals MCx and Ox also drive P-channel transistors 1011 and 1012, respectively, coupled in series between node OUTD and power high.

However, note that in this embodiment transistors 1011 and 1012 are coupled between-output node OUTD and a power high value of VGG, rather than VDD. As described above with reference to FIG. 7B, power high VGG has a higher voltage level than the voltage level of power high VDD. This modification from the standard NOR circuit allows the pass gates driven by NOR gates O4–O11 to pass a high value in a shorter time than would otherwise be possible.

FIGS. 6–10 illustrate the application of a novel multiplexing structure to input multiplexers driving function generator input terminals. However, the principles of the invention can also be applied to other aspects of FPGA circuitry—for example, to signal lines within the general interconnect structure of the FPGA.

Figure 11:
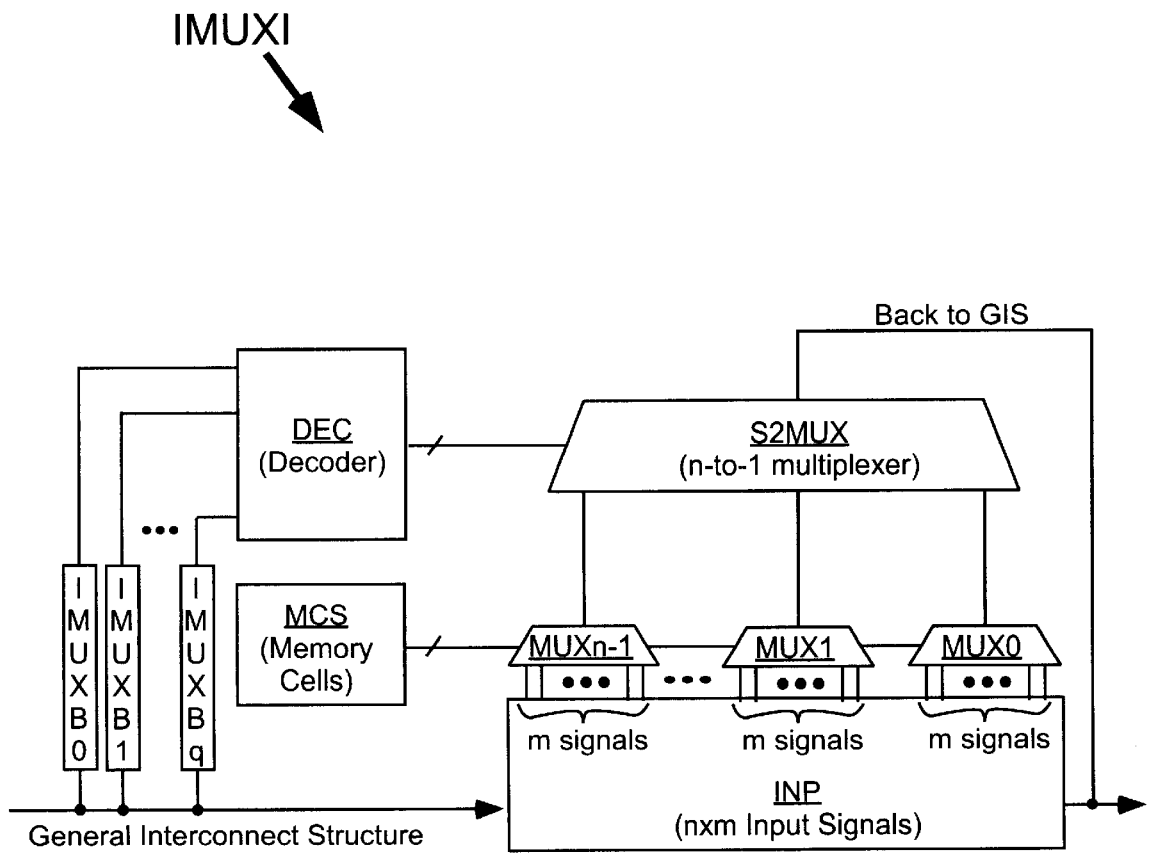
FIG. 11 is a schematic diagram of a novel interconnect multiplexing circuit IMUXI that can be included in the general interconnect structure of an FPGA to provide more flexible routing of user signals, according to a fourth embodiment of the invention.

FIG. 11 shows an interconnect multiplexing circuit IMUXI that can be included in the general interconnect structure of an FPGA to provide added multiplexing capability, according to a fourth embodiment of the invention.

Interconnect multiplexing circuit IMUXI is similar to input multiplexer IMUXn of FIG. 6, except that the output signal from the multiplexer drives one of the signal lines in the general interconnect structure. Interconnect multiplexing circuit IMUXI provides the novel capability of selecting one of many available interconnect lines for connection to another interconnect line, based not just on signal values stored in memory cells, but also on signal values derived from others of the interconnect lines. Thus, wide multiplexers can be implementing within the general routing structure itself.

Those having skill in the relevant arts of the invention will now perceive various modifications and additions that may be made as a result of the disclosure herein. For example, FPGAs, CLBs, general interconnect structures, multiplexers, multiplexing circuits, input multiplexers, decoders, memory cells, transistors, NAND gates, NOR gates, AND NOR gates, and buffering circuits other than those described herein can be used to implement the invention. Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims-and their equivalents.

What is claimed is:

1. A configurable logic block (CLB) in a Field Programmable Gate Array (FPGA), the FPGA comprising a general interconnect structure and a plurality of the CLBs, the CLB comprising:

a function generator having a plurality of data input terminals;

first and second bypass input multiplexers each having a plurality of input terminals coupled to the general interconnect structure and each further having an output terminal coupled to bypass the function generator data input terminals; and a first data input multiplexer coupled between the general interconnect structure and a first one of the data input terminals of the function generator, the first data input multiplexer comprising:

a plurality of data input terminals coupled to the general interconnect structure;

a decoder circuit having a plurality of input terminals coupled to the output terminals of the first and second bypass multiplexers and further having a plurality of output terminals; and a second stage multiplexer having a plurality of select terminals coupled to the output terminals of the decoder circuit, a plurality of data input terminals coupled to the data input terminals of the first data input multiplexer, and an output terminal coupled to a first one of the data input terminals of the function generator.

2. The CLB of claim 1, wherein the second stage multiplexer comprises a 4-to-1 multiplexer.

3. The CLB of claim 2, wherein the first data input multiplexer comprises a 36-to-1 multiplexer.

4. The CLB of claim 1, wherein the first data input multiplexer further comprises:

a plurality of third multiplexers coupled between the general interconnect structure and the data input terminals of the second multiplexer.

5. The CLB of claim 4, wherein:

the first data input multiplexer further comprises a plurality of configuration memory cells; and each of the third multiplexers comprises at least one select terminal coupled to one of the configuration memory cells.

6. The CLB of claim 4, wherein:

the CLB further comprises third and fourth bypass input multiplexers each having a plurality of input terminals coupled to the general interconnect structure and each further having an output terminal coupled to bypass the function generator data input terminals;

the first data input multiplexer further comprises a second decoder having a plurality of input terminals coupled to the output terminals of the third and fourth bypass multiplexers and further having a plurality of output terminals; and each of the third multiplexers comprises at least one select terminal coupled to one of the output terminals of the second decoder.

7. The CLB of claim 1, wherein the decoder circuit comprises a configuration memory cell coupled to enable and disable the second stage multiplexer.

8. The CLB of claim 1, wherein the second stage multiplexer comprises:

an internal node;

a plurality of transistors coupled between the data input terminals of the second stage multiplexer and the internal node, each transistor having a gate terminal;

a plurality of logic gates having output terminals coupled to the gate terminals of the transistors; and a buffer coupled between the internal node and the output terminal of the second stage multiplexer.

9. The CLB of claim 8, wherein:

the second stage multiplexer further comprises a plurality of configuration memory cells; and each of the plurality of logic gates comprises an input terminal coupled to one of the configuration memory cells.

10. The CLB of claim 1, further comprising a second data input multiplexer coupled between the general interconnect structure and a second one of the data input terminals of the function generator.

* * * * *